US008817430B2

(12) United States Patent
Simon et al.

(10) Patent No.: US 8,817,430 B2
(45) Date of Patent: Aug. 26, 2014

(54) AC VOLTAGE CONTROLLER (75) Inventors: Helmut Simon, Argenbühl (DE);
Andreas Landerer, Ofterschwang (DE);
Werner Kaps, Weiler-Simmerberg (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 422 days.

(21) Appl. No.: 13/162,953

(22) Filed: Jun. 17, 2011

(65) Prior Publication Data
US 2011/0309816 A1 Dec. 22, 2011

(30) Foreign Application Priority Data
Jun. 17, 2010 (DE) .......................... 10 2010 024 128

(51) Int. Cl.
*H01L 21/00* (2006.01)

(52) U.S. Cl.
USPC .............................................. 361/18; 361/19

(58) Field of Classification Search
CPC . H03K 17/687; H03K 17/102; H03K 17/063; H03K 17/161; H03K 17/145; H03K 17/302; H03K 17/6874; H03K 2217/0009; H02M 1/32; H02M 1/36; H02M 1/38
USPC ............... 361/18, 19; 315/307; 323/270, 271; 327/427

See application file for complete search history.

(56) References Cited

U.S. PATENT DOCUMENTS

| 5,808,327 | A | * | 9/1998 | Maier et al. ................... 257/161 |
| 5,932,934 | A | | 8/1999 | Hofstetter et al. |
| 7,994,827 | B2 | * | 8/2011 | Williams ....................... 327/110 |
| 2003/0201760 | A1 | * | 10/2003 | Umemoto et al. ............ 323/271 |
| 2004/0227560 | A1 | * | 11/2004 | de Buda ........................ 327/427 |
| 2005/0068017 | A1 | * | 3/2005 | Lipcsei ......................... 323/282 |
| 2009/0103223 | A1 | * | 4/2009 | Prussmeier ................... 361/93.9 |
| 2012/0049234 | A1 | * | 3/2012 | Cheng ............................. 257/99 |
| 2012/0049826 | A1 | * | 3/2012 | Hsu et al. ....................... 323/284 |

FOREIGN PATENT DOCUMENTS

| DE | 41 17 122 A1 | 11/1992 |
| DE | 103 30 285 A1 | 10/2004 |

* cited by examiner

*Primary Examiner* — Rexford Barnie
*Assistant Examiner* — Angela Brooks
(74) *Attorney, Agent, or Firm* — Laurence A. Greenberg; Werner H. Stemer; Ralph E. Locher (57) ABSTRACT An AC voltage controller has two transistors which can be positioned between two AC voltage terminals in series with a load. The two transistors are connected in series in such a way that their respective source terminals are connected to one another. The AC voltage controller also contains a signal generator for generating a switching signal for actuating the two transistors, a buffer which is connected downstream of the signal generator and which is set by the signal generator in order to actuate the two transistors. An actuation circuit or driver circuit is connected downstream of the buffer, for the purpose of actuating the two transistors in accordance with the set state of the buffer. A current-limiting circuit is provided for limiting or switching off the current through the two transistors in the case of an excessively large current through the load.

12 Claims, 6 Drawing Sheets

AC VOLTAGE CONTROLLER

CROSS-REFERENCE TO RELATED APPLICATION

This application claims the priority, under 35 U.S.C. §119, of German application DE 10 2010 024 128.8, filed Jun. 17, 2010; the prior application is herewith incorporated by reference in its entirety.

BACKGROUND OF THE INVENTION

Field of the Invention

The present invention relates to an AC voltage controller, in particular an AC voltage controller having an AC voltage switching stage which contains two transistors which are connected in series.

AC voltage controllers of this type are required, for example, in energy management systems or domestic automation systems which contain a number of electrical or electronic devices or components (for example lights, blinds, etc.) whose operation is to be controlled.

AC voltage controllers, in particular AC voltage controllers for lighting devices, were typically constructed with triacs in the past. Owing to the property of the triac to remain switched on, once it has been fired, until the zero current crossing is reached, only what is referred to as phase-controlled modulation was possible with an acceptable degree of expenditure. A disadvantage of phase-controlled modulation when it is used to control lights is perceptible buzzing of the lamp's filament owing to the steep rise in current. Increased emission of interference signals, which also has a negative effect with other resistive and capacitive loads, is also associated with the steep rise in current. The extraction of a nonsinusoidal current also gives rise to harmonics whose values are limited in power networks by relevant standards.

In order to implement a phase trailing edge which advantageously avoids the disadvantages of the phase leading edge, since the current is activated at the zero crossing and rises comparably slowly with the sine wave of the power system voltage, there is the possibility of connecting the load in series with the AC voltage terminals of a bridge rectifier and operating a switching transistor at the DC voltage terminals of the bridge rectifier. When the transistor on the DC voltage side is switched on, a current begins to flow on the AC voltage side regardless of the polarity of the AC power network at that particular time. It is disadvantageous here that when the load is switched on both the conducting state power loss and the switching power loss occur at the two conducting diodes of the bridge rectifier and additionally at the switching transistor, and the maximum switching power which can be accommodated in a small volume is therefore limited.

For some years, owing to the progress in the development of power MOSFETs AC voltage switching stages have been commercially available in which two MOSFETs are connected in series in such a way that their source terminals are connected to one another and the load is connected thereto in series. If this source connection is used as a reference point of an actuation circuit, both MOSFETs can be switched on with a signal which is positive compared to this reference point. An advantage with such a MOSFET switching stage is that a power loss occurs only at one diode, the parasitic diode, of the transistor. In the case of a very low on-resistance of the MOSFET, its own power loss is low compared to that of the diode path or paths; and compared to the principle described above by means of rectifiers, the overall power loss is at best almost halved. If a load is switched on or off only statically, it is therefore sufficient if a signal generator actuates both MOSFET gates in parallel via a driver module.

SUMMARY OF THE INVENTION

The object of the invention is to provide an improved AC voltage controller with an AC voltage switching stage with two transistors which are connected in series which has a compact design and permits effective limiting of the current.

The AC voltage controller has two transistors which can be positioned between two AC voltage terminals in series with a load. The two transistors are connected in series in such a way that their respective source terminals are connected to one another. A signal generator is provided for generating a switching signal for actuating the two transistors. The AC voltage controller also has a buffer which is connected downstream of the signal generator and which is set by the signal generator, in order to actuate the two transistors, and an actuation circuit or driver circuit which is connected downstream of the buffer, for actuating the two transistors in accordance with the set state of the buffer.

The use of the buffer downstream of the signal generator makes possible a measure for limiting the two transistors of the AC voltage switching stage which is very fast and of very simple design. A small overall volume for the AC voltage controller is advantageous when it is installed in energy management systems or domestic automation systems and is installed in particular in in-wall sockets there.

When the buffer is set by the pulse generator, the AC voltage switching stage is switched on by the additional actuation circuit and when the buffer is reset by the pulse generator, the AC voltage switching stage is switched off. In this way, the buffer also makes it possible to relieve the loading on the signal generator.

The signal generator contains, for example, a microcontroller, but it can also be a simple momentary contact switch. The buffer contains, for example, a flipflop circuit.

Preferably MOSFETs or power MOSFETs are used for the two transistors of the alternating voltage switching stage. However, the circuit principle according to the invention basically also functions with IGBTs and bipolar transistors, with which a diode is connected in anti-parallel with respect to the flowing direction from the plate to the emitter.

The buffer can be connected to the signal generator either via a signal line, which transmits the switching signals for switching on and switching off or via two signal lines which transmit the switching signals for switching on or switching off.

According to the invention, a current-limiting circuit is also provided for limiting or switching off the current through the two transistors in the case of an excessively large current through the load. Owing to the buffer which is present, this current-limiting circuit can be of very simple and compact design.

The current-limiting circuit preferably has a first and a second switching element (for example transistors or comparators) as well as at least one resistor which is connected in series with the two transistors of the AC voltage switching stage. A voltage drop at the at least one resistor in the one direction of current through the load connects through the first switching element and a voltage drop at the at least one resistor in the other direction of current through the load connects through the second switching element. In the case of such a through-connection, the first or second switching element actuates the signal generator and/or the buffer in such a way that the two transistors of the AC voltage switching stage are switched off.

In one embodiment, the current-limiting circuit contains a first resistor in series with the first transistor, and a second resistor in series with the second transistor. Given a positive direction of current through the load, the voltage drop across the first series resistor switches on the first switching element, and given a negative direction of current through the load the voltage drop across the second series resistor switches on the second switching element.

In another embodiment, the current-limiting circuit contains just one resistor in series with the first and second transistors of the AC voltage switching stage. Given a positive direction of current through the load, the voltage drop across this series resistor switches on the first switching element, and given a negative direction of current through the load the voltage drop across this series resistor switches on the second switching element.

In both embodiments, the through-connection of one of the two switching elements of the current-limiting circuit brings about resetting of the buffer, in order thus to switch off the AC voltage switching stage, and/or brings about triggering of the signal generator, in order to prevent renewed setting of the buffer.

In a further refinement of the invention, one output of the buffer is connected to an input of the signal generator. In this way, the signal generator can at any time sense the current switched state of the buffer and therefore also of the transistors of the AC voltage switching stage.

For example, the signal generator can in this way detect when the state of the buffer changes. In this case, the signal generator can, for example, also detect that this change has taken place without the signal generator itself having sent a corresponding reset signal. From this, the signal generator can then conclude, for example given the presence of the current-limiting circuit described above, that an excess current must have been the cause of the resetting of the buffer.

In yet a further refinement of the invention, the signal generator is configured to sense a voltage drop across the load. For this purpose, for example a first input of the signal generator is connected to a first terminal of the load (directly or via, for example, a conditioning circuit), and a second input of the signal generator is connected to a second terminal of the load (directly or via, for example, a conditioning circuit), in order to sense the voltage profiles at the two terminals of the load. From the two voltage profiles which are sensed in this way, the unfalsified load voltage profile can then be calculated in the signal generator as a difference between the two individual voltages.

In yet a further refinement of the invention, the signal generator is designed to sense a current profile through the load.

If the voltage profile and current profile across or through the load are sensed, the power which is taken up by the load can advantageously be determined therefrom.

If the current profile through the load is sensed by the signal generator, the signal generator can reduce the actuation power or entirely switch it off, for example when a predefined threshold value is exceeded (for example for the chronological mean value of the measured current). In the case of a non-linear load (for example a filament lamp or capacitor), the signal generator can, for example, increase the actuation percentage during the switch-on process incrementally up to the desired final value.

For the purpose of measuring current, for example a capacitor is provided which extracts an AC voltage drop which is proportional to the AC voltage component across the at least one resistor and feeds it to an input of the signal generator (directly or via an evaluation circuit). The capacitor extracts the AC voltage drop which is proportional to the AC component across the at least one resistor, preferably sending it to a voltage divider.

The signal generator can also be designed so as to set a ratio of the voltage divider. This can be done, for example, by virtue of the fact that at least one impedance is connected in parallel with the voltage divider by the signal generator.

In one refinement of the invention, the signal generator is also configured to sense a reference current when the load is switched off or when the current is known, and to take this reference current into account in the sensing of the current profile through the load.

A tolerance of the voltage divider can be eliminated, for example, by virtue of the fact that software of the signal generator senses a corresponding current reference value through the load when the load is switched off (by the two transistors of the AC voltage switching stage). During later current measurements, correct current values can then be determined by adjusting the measured values with the current reference value.

A tolerance of the series resistor for measuring current can be eliminated, for example by virtue of the fact that when the current through the load is known a reference measurement is carried out and a correction value which characterizes the deviation between the measured current value and the actual current value is stored in a memory. During later current measurements, correct current values can then be determined by virtue of the fact that the measured values are adjusted with the stored correction value.

In one refinement of the invention, the signal generator is also configured in such a way that when a non-linear load is switched on (for example filament lamp or capacitor) the signal generator ignores a response by a current-limiting device for a predetermined time period.

In yet a further refinement of the invention, the signal generator is provided with an (internal or external) memory in which a switch-on behaviour of the load which has been determined once or multiple times can be stored. In particular in the case of non-linear loads, it is then possible during subsequent switch-on processes to increase the actuation percentage through the signal generator incrementally up to the desired final value. In this context, the increasing steps are preferably selected in comparison with the considered switch-on behaviour in such a way that the current-limiting means still just fails to respond.

A possible exemplary application of the AC voltage controller according to the invention is an AC dimmer for controlling the brightness of a filament lamp.

Other features which are considered as characteristic for the invention are set forth in the appended claims.

Although the invention is illustrated and described herein as embodied in an AC voltage controller, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
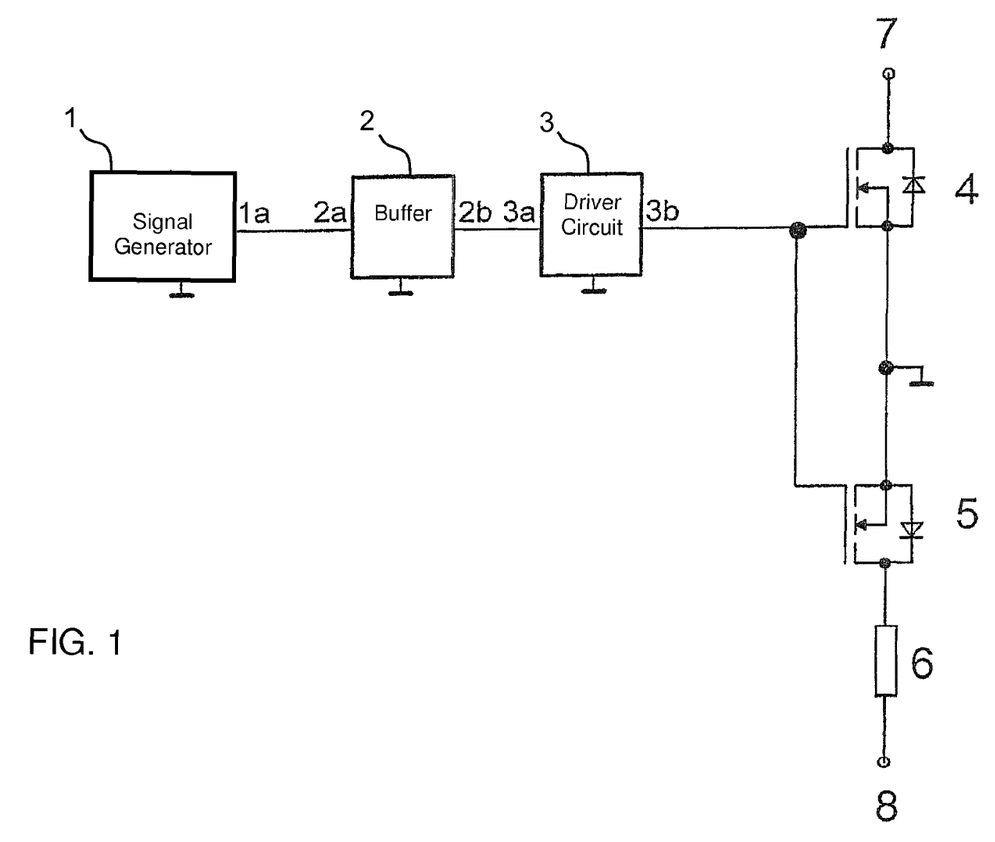
FIG. 1 is a simplified block circuit diagram of a basic form of an AC voltage controller according to the invention.

Referring now to the figures of the drawing in detail and first, particularly, to FIG. 1 thereof, there is shown the basic form of an AC voltage controller according to the invention.

The AC voltage controller in FIG. 1 contains a signal generator 1, which preferably contains a microcontroller and a memory. An output 1a of the signal generator 1 is connected to an input 2a of a buffer 2. The signal generator sets the buffer 2 to the state "on" or to the state "off" via the signal line 1a-2a.

An output 2b of the buffer 2 is connected to an input 3a of an actuation circuit or driver circuit 3. This actuation circuit then controls the AC voltage switching stage via the output 3b in accordance with the set state of the buffer 2.

The AC voltage switching stage contains two transistors (preferably MOSFETs or power MOSFETs) 4 and 5. The transistors 4 and 5 are connected in series in such a way that their respective source terminals are connected to one another. Furthermore, a load 6 is connected in series with this series connection of the two transistors 4, 5.

The AC power system voltage is present at the two AC voltage terminals 7 and 8. If the connection of the two source terminals is used as the reference point of the actuation circuit 3, the two MOSFETs can be switched on with a signal which is positive compared to this reference point. If, given a positive half wave, the first terminal 7 in the voltage is positive compared to the second terminal 8, when the first transistor 4 is switched on a current flows from the first AC voltage terminal 7 across the first transistor 4 and the parasitic diode of the second transistor 5 through the load 6 to the second AC voltage terminal 8. Conversely, in the negative half wave a current flows from the second AC voltage terminal 8 through the load 6 across the actuated second transistor 5 and the parasitic diode of the first transistor 4 to the first AC voltage terminal 7.

It is advantageous with such an AC voltage switching stage with MOSFETs that power loss occurs at just one diode, the parasitic diode of the transistor. Given a very low on-impedance of the MOSFET, its own power loss is low, compared to that of the diode path or paths.

If a load 6 is only switched on or off statically, it is therefore sufficient if one voltage generator 1 actuates both MOSFET gates in parallel via the driver module 3. If, according to the invention, a buffer 2 is connected between the signal generator 1 and the actuation circuit 3, the buffer relieves the loading on the signal generator 1 over time.

In order to control a phase trailing edge, a square wave signal in the signal generator 1 or some other circuit part must also be generated, which square wave signal switches on synchronously with the zero crossing of the AC voltage and switches off again after a time before the subsequent zero crossing. Basically, a signal which has any desired frequency and which is not synchronized with the AC voltage, for example a pulse-width-modulated signal, can also serve for controlling the power. However, the power losses and disruptions which occur then have to be taken into account in the circuit configuration. The following statements relate expressly to all possible signal shapes of the actuation signal.

Figure 2:
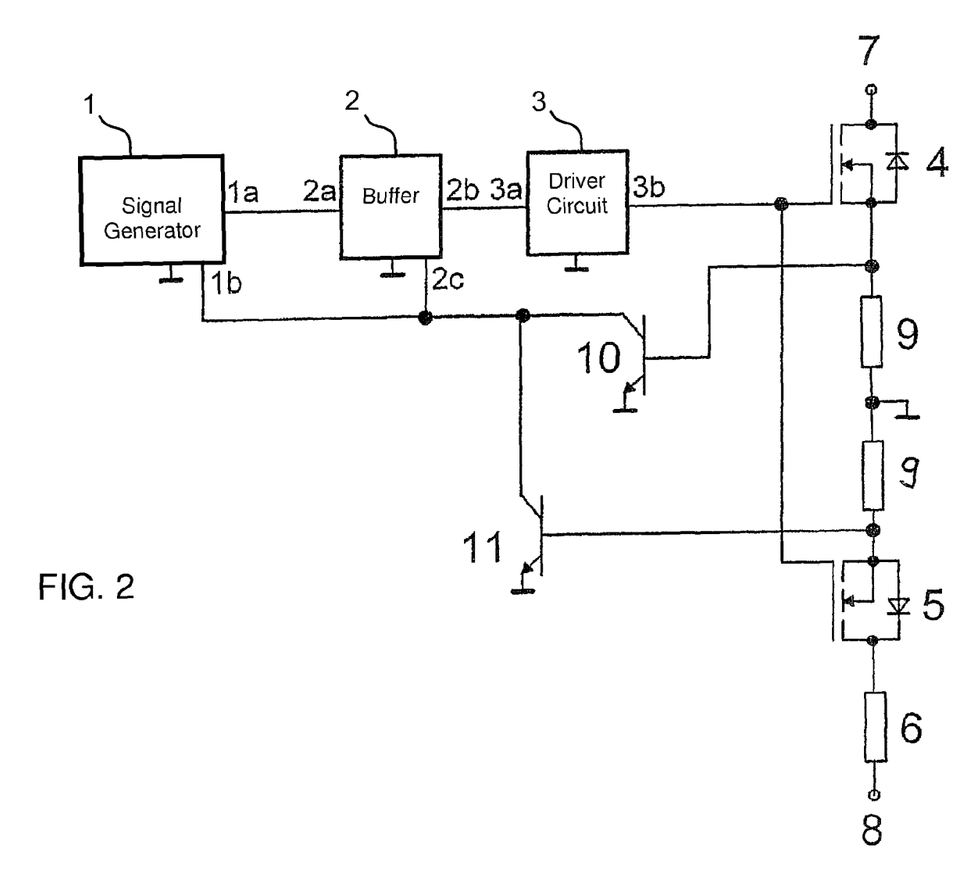
FIG. 2 is a simplified block diagram of the AC voltage controller according to a first exemplary embodiment of the invention.

Referring to FIG. 2, a first exemplary embodiment of an AC voltage controller will now be described in more detail. Identical or corresponding components are characterized here with the same reference numbers as in FIG. 1.

A large problem for semiconductor switches is unacceptably high currents or current peaks, such as can occur, for example, in the event of a short-circuit of the load 6. Such short-circuits frequently occur for a brief time, for example, when the filament of a lamp burns through and the short-circuits can lead to the destruction of the transistors 4, 5 of the AC voltage switching stage.

Since the AC voltage switching stage has to be switched off as quickly as possible in order to counteract the steep rise in current in the event of a short-circuit, coupling by hardware is recommended. Switching off on the basis of excess current evaluation by software is normally too slow.

The voltage drop at two resistors 9 which are connected in series between the two source terminals of the transistors 4, 5 can be utilized for current limiting. The two series resistors 9 are each coupled to a switching element (for example transistor or comparator) 10, 11 in order to reduce the switch-on potential of the conducting transistor 4, 5 directly or via the actuation circuit 3 or via the state memory 2 or via the signal generator 1. As a result, the current is switched off or at least limited. As illustrated in FIG. 2, the two switching elements 10, 11 of the current-limiting circuit are connected in parallel. The resistors 9 are to be dimensioned in such a way here that at the rated current they do not impede the actuation of the transistor 4, 5 by raising the source (or emitter) potential to an unacceptably large degree.

In the case of a positive direction of current through the load 6, the voltage drop across the first series resistor 9 switches on the first switching element 10, while in the case of a negative direction of current through the load 6 the voltage drop across the second series resistor 9 switches on the second switching element 11. This through-connection of one of the two switching elements 10, 11 brings about resetting of the buffer 2, in order thus to switch off the AC voltage switching stage 4, 5, and/or brings about triggering of the signal generator 1, in order to prevent renewed setting of the buffer 2.

The remaining features of the AC voltage controller in FIG. 2 correspond to those in FIG. 1.

Figure 3:
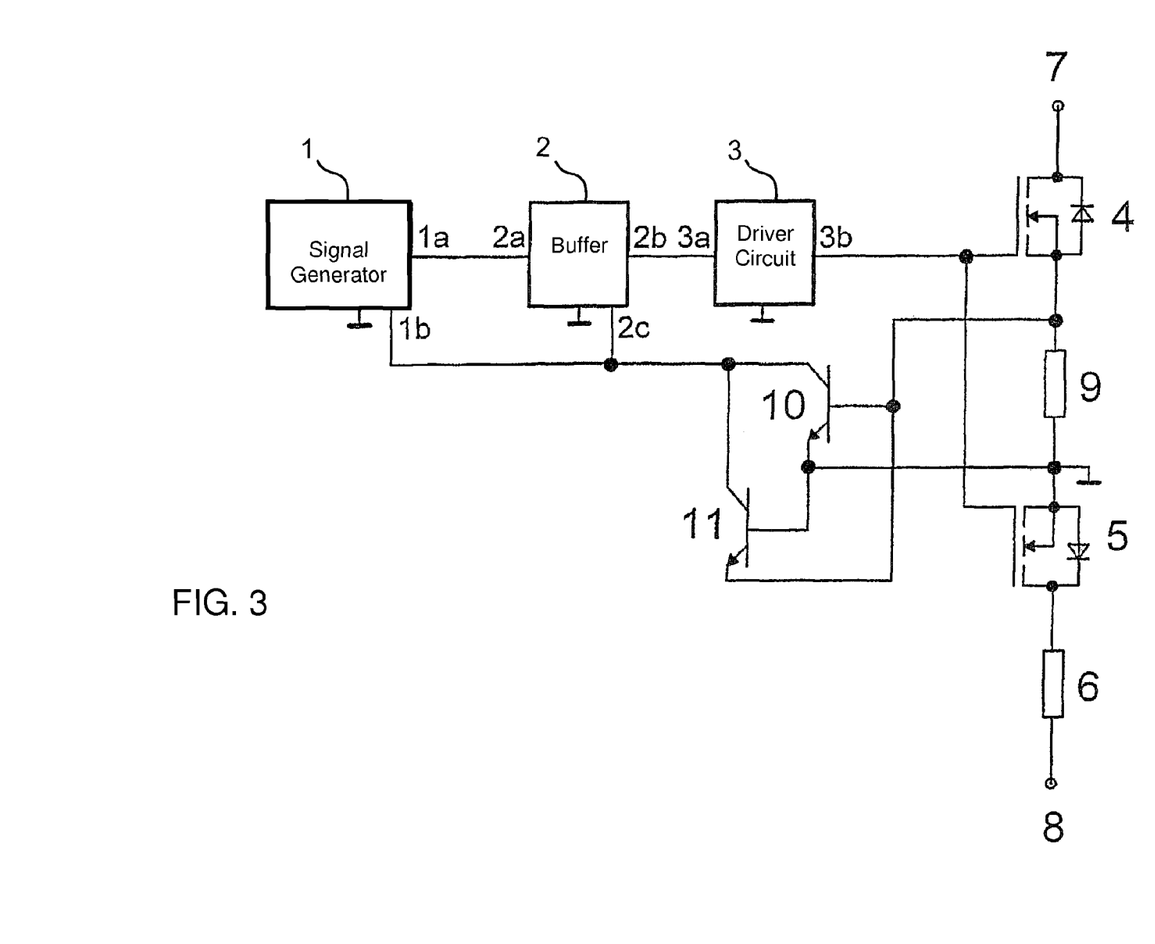
FIG. 3 is a simplified block diagram of the AC voltage controller according to a second exemplary embodiment of the invention.

Referring to FIG. 3, a second exemplary embodiment of an AC voltage controller will now be described in more detail. Identical or corresponding components are characterized here with the same reference numbers as above.

A disadvantage of the current-limiting circuit illustrated in FIG. 2 is that two power resistors 9 are used. Even if they only each have to have half the power value because of the dividing of power loss, in terms of layout they require significantly more space, which is possibly not at all available, therefore making the circuit impossible to construct. On the one hand, two components are larger than a single component, and on the other hand an insulating distance has to be maintained around the then four terminals of the components on the printed circuit board, which insulating distance itself requires a considerable amount of space depending on the application. In addition, two equivalent components with half the power are generally more expensive than a single component, and the equipping costs are also doubled.

Therefore, in FIG. 3 an AC voltage controller with a current-limiting circuit 9-11 is proposed which only requires one series resistor 9 for the measurement of current. This series resistor 9 is connected in series between the source terminals of the two transistors 4, 5 of the AC voltage switching stage and is coupled to the two switching elements 9 and 10 which are connected in parallel.

In the case of a flow of current in the one power system half wave from the first AC voltage terminal 7 to the second AC voltage terminal 8, a voltage drop, which actuates the first switching element 10, occurs at the resistor 9. A reverse flow of current from the second AC voltage terminal 8 to the first AC voltage terminal 7 in the negative power system half wave generates a voltage drop in the respectively reverse direction at the resistor 9, which voltage drop actuates the second switching element 11.

In this context, the potential at the emitter of the second switching element 11 is negative compared to the reference potential. If the second switching element 11 is switched on completely, a connected logic gate could therefore be damaged. Such a gate is used, for example, as a buffer 2 or signal generator 1. However, since the transistor 11 cannot switch on infinitely quickly, at first the threshold voltage of the gate is undershot at least once at its input 2c, and it already switches off its output, and therefore the power MOSFET 4 or 5 which is connected through at that particular time, before a negative voltage can occur at the input 2c of the buffer 2 or at the input 1b of the signal generator 1.

Instead of the bipolar transistors which are shown in FIG. 3, other switching elements such as MOSFETs or comparators can also be used for the switching elements 10, 11 of the current-limiting circuit.

In the case of an AC voltage controller it is important that in the event of a short-circuit the transistors 4, 5 are switched off completely and also remain switched off. Therefore, the buffer 2 which is connected downstream of the signal generator 1 is of particular advantage. In addition to the function of buffering the switched state of the signal generator 1, which was described at the beginning, in this exemplary embodiment it assumes, as a further important function, the task that, in the case of an excess current, it maintains the switched-off state of the AC voltage switching stage until switching on by the signal generator 1 next occurs.

Flipflop circuits in various embodiments are suitable as buffers 2. In the case of a simple set/reset flipflop, for example the signal generator 1 would alternately generate a setting signal and a resetting signal over two lines (not illustrated here). In the case of an excess current, the output signal, which is fed to the resetting input, of the first or second switching element 10, 11 of the current-limiting circuit would bring about immediate resetting. In the case of a D-flipflop or JK-flipflop, alternatively just a single input 2a of the buffer 2 is necessary for control by means of the signal generator 1. As a result, one output on the signal generator 1 can advantageously be eliminated. The resetting is then carried out by means of a reset input, preset input or clear input of the flipflop, depending on the configuration of the circuit.

If the transistor 4, 5 is switched off once by the current-limiting circuit described, that is to say the buffer 2 is reset, the transistor 4, 5 is switched on again with the next setting signal of the signal generator 1. In the case of a very rapidly switching signal chain this may be sufficient to protect the transistor 4, 5 and the rest of the circuit against overloading. If not, it is desirable to prevent the signal generator 1 from switching on the load again.

For this purpose it is possible, as illustrated in FIG. 3, for the same signal, which originates from the first or the second switching element 10, 11 and resets the buffer 2, to advantageously signal to the signal generator 1, via a further input 1b, that an excess current is present. The signal generator 1 can react thereto in a suitable way. For example, it can allow a renewed actuation signal not to occur for a certain time. This can be easily achieved with conventional timing elements such as, for example, mono-vibrators. However, if a microcontroller is used as the signal generator 1, significantly more intelligent algorithms are also possible. It is, however, necessary to bear in mind here that the signal is available only for a very brief time and therefore requires a specific, for example edge-triggered, input 1b.

Figure 4:
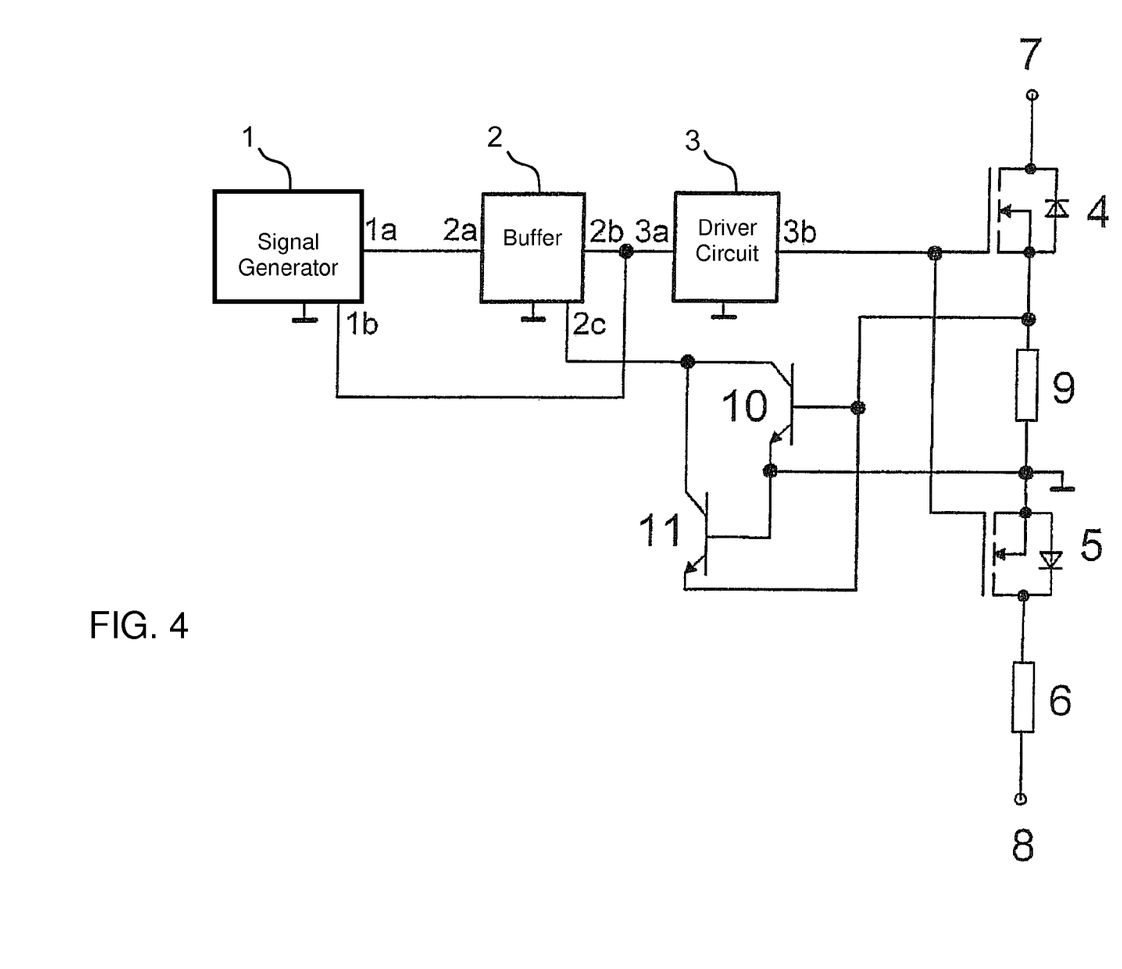
FIG. 4 is a simplified block diagram of the AC voltage controller according to a third exemplary embodiment of the invention.

This last-mentioned disadvantage is avoided with the AC voltage controller according to the third exemplary embodiment. As illustrated in FIG. 4, for this purpose the output 2b of the buffer 2 is connected to the input 1b of the signal generator 1. As a result, the signal generator 1 can, on the one hand, detect at any time the instantaneous switched-on state of the overall system, and on the other hand, if it has not brought about the resetting of the buffer 2 itself, it can detect that this has been brought about by an excess current.

The remaining features of the AC voltage controller in FIG. 4 correspond to those of the second exemplary embodiment in FIG. 3.

Figure 5:
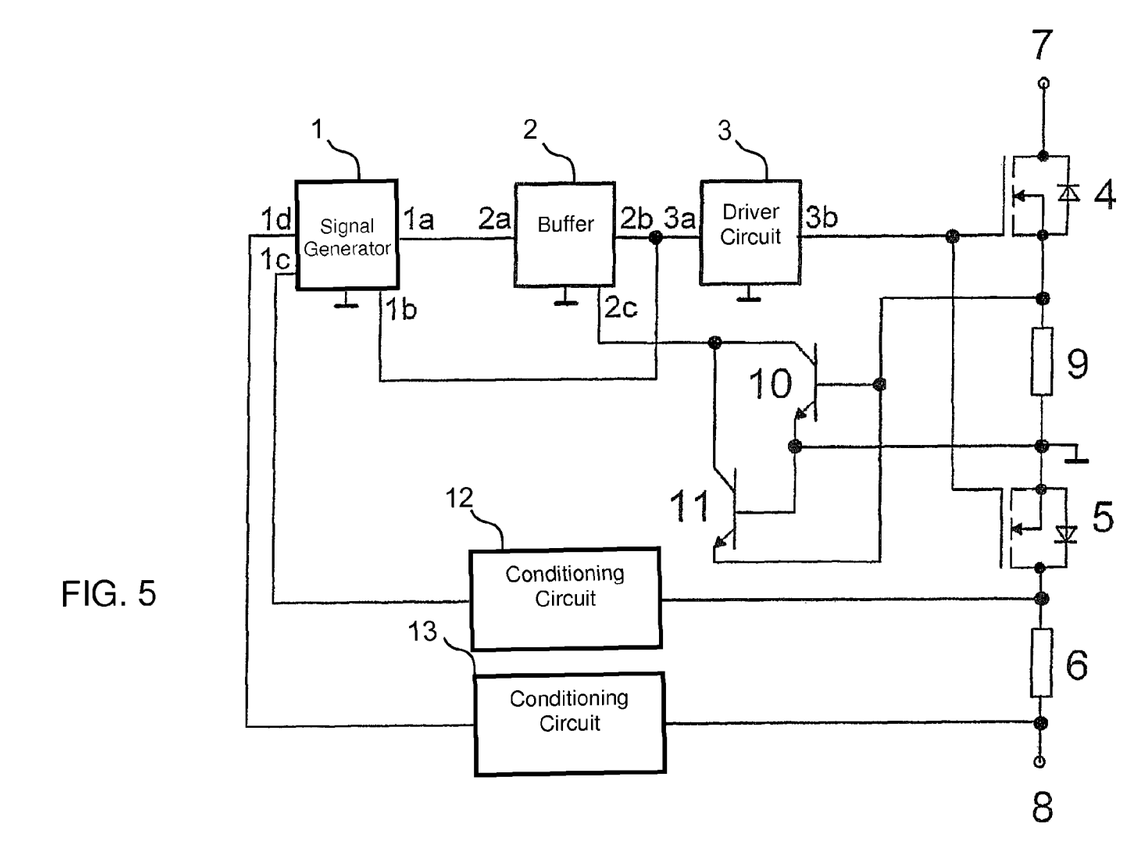
FIG. 5 is a simplified block diagram of the AC voltage controller according to a fourth exemplary embodiment of the invention.

Referring to FIG. 5, a fourth exemplary embodiment of an AC voltage controller will now be described in more detail. Identical or corresponding components are characterized here by the same reference numbers as in the above exemplary embodiments.

In addition to the exemplary embodiments described above, it may also be desirable to be able to measure the electrical power and energy taken up by the load 6. For this purpose, the current profile and voltage profile across the load 6 must be determined.

The problem in measuring the voltage across the load 6 is that the reference potential of the actuation circuit 3 of the transistors 4, 5 is present between the source terminals thereof, between the second transistor 5 and the resistor 9 in this exemplary embodiment. For reasons of cost, efforts are made to feed the voltage across the load 6 to an input 1d of the signal generator 1 after signal conditioning (for example filtering). However, since the second transistor 5 is present between the reference potential of the signal generator 1 and the load 6, the voltage drop across the latter falsifies the measurement. This is the case particularly because in one half wave the transistor 5 conducts, and in the other half its parasitic anti-parallel diode conducts, depending on the actuation state. Although the power is the product of the current and the voltage, and in the switched-off state the current is zero, with the result that in this time the precise voltage profile is not of interest and it would therefore be possible to measure the voltage only at the second AC voltage terminal 8, voltage distortions occur on the on-state path and on the anti-parallel diode as a result of the switching processes and voltage drops and falsify the result.

In the prior art it is known, for the purpose of measuring power, to use either a circuit which is electrically isolated from the load by means of a current and voltage transformer, or to configure the electrical isolation at the interface with the signal generator. The pure voltage across the load can therefore be measured directly. However, the electrical isolation is costly and takes up a lot of space on the printed circuit board.

According to the fourth exemplary embodiment, this problem is solved in such a way that the voltage profile on the one side of the load 6 [U1=U(5)+U(6)] is acquired at a first analogue input 1d of the signal generator 1, and the voltage profile on the second side of the load 6 [U2=U(5)] relative to the specified reference potential is acquired at a second analogue input c of the signal generator 1. Formation of differences between the two acquired signals is then carried out in the signal generator 1.

$$U = U1 - U2 = U(5) + U(6) - U(5) = U(6)$$

In this way, the unfalsified voltage profile at the load 6 is available to the signal generator 1. Instead of an analogue input 1c, 1d, an operational amplifier input or some other input which is suitable for determining voltage can also be used at the signal generator 1.

The voltage signals U1 and U2 which are tapped on both sides of the load 6 are fed to the signal generator 1, preferably in each case via a conditioning circuit 12 or 13, as illustrated in FIG. 5. These conditioning circuits 12, 13 contain, for example, a circuit with an analogue converter for signal conditioning (for example filtering).

The remaining features of the AC voltage controller in FIG. 5 correspond to those in the above exemplary embodiments.

Figure 6:
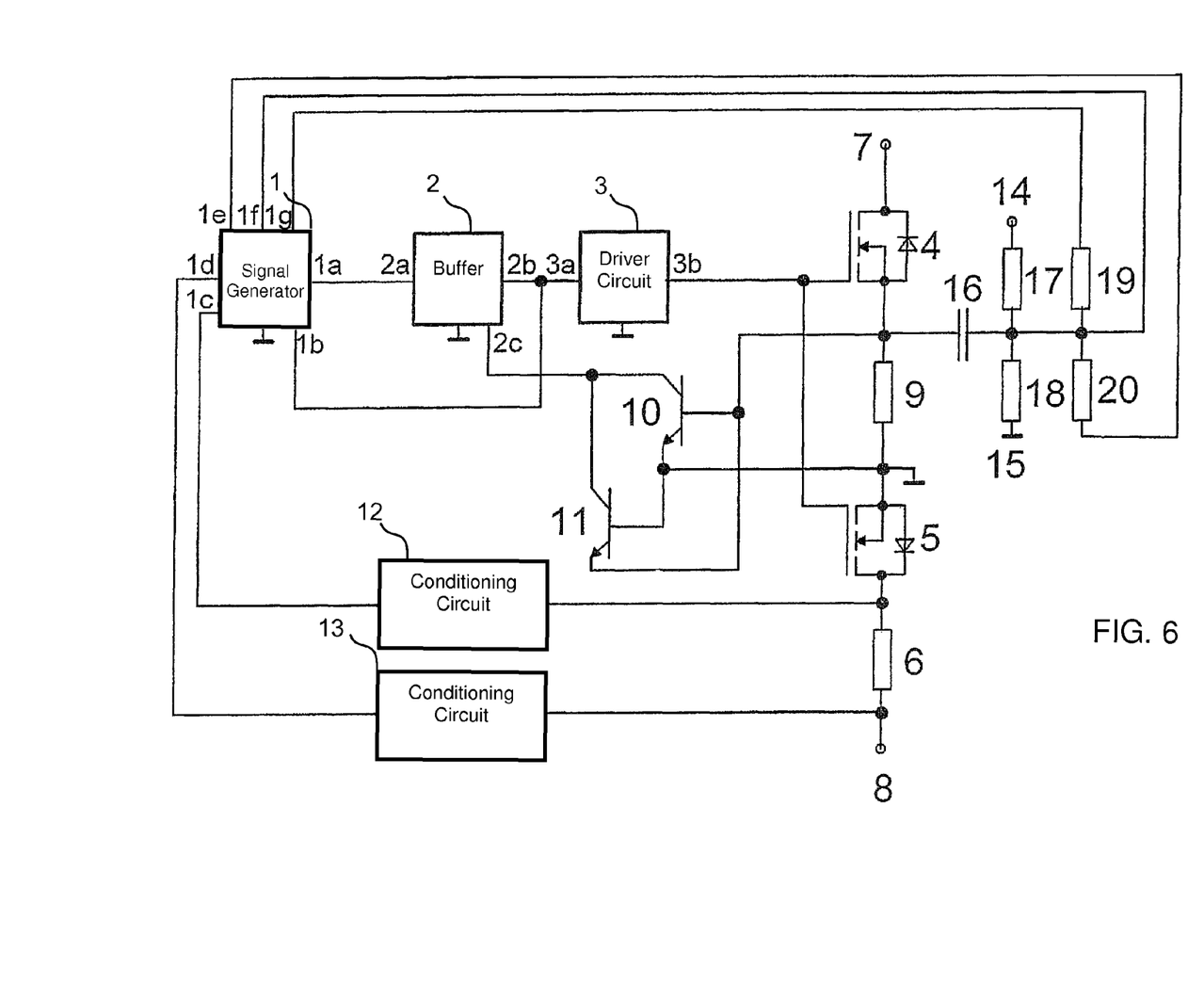
FIG. 6 is a simplified block diagram of an AC voltage controller according to a fifth exemplary embodiment of the invention.

Referring to FIG. 6, a fifth exemplary embodiment of an AC voltage controller will now be described in more detail. Identical or corresponding components are characterized here by the same reference numbers as in the above exemplary embodiments.

The measurement of current is usually carried out by a current/voltage conversion. This can basically be done by means of a transformer or by means of the voltage drop at a resistor through which the load current flows. It is prior art to use the same resistors 9 for this as are used for limiting the current.

In the exemplary embodiment in FIG. 6, a single resistor 9 is sufficient for measuring the current. Since the voltage drop, which is proportional to the current profile, across this resistor relative to the reference potential of the circuit in the negative power system half wave in the case of a resistive load 6 is also negative, it must be raised to a mean value potential which is positive in relation to the reference potential and can be evaluated at a preferably analogue input 1f of the signal generator 1. For this purpose, two resistors 17 and 18 form a voltage divider. A DC voltage, preferably the supply voltage of the circuit itself, is fed in via the terminals 14 and 15 of the voltage divider.

The AC voltage component which is proportional to the AC current is fed in at the centre point of the AC voltage switching stage via a capacitor 16. A microcontroller 1, which evaluates the signal at the input 1f, knows that the DC voltage offset corresponds to the current value zero, that a voltage above it corresponds to a current in the positive direction, and that a voltage below it corresponds to a current in the negative direction.

Asymmetrical loads 6, which load positive and negative halfwaves unequally, cannot be measured precisely in this way. This is irrelevant in most applications which come into question.

In the abovementioned circuit arrangement, a pre-amplifier which is connected downstream and which is integrated into the signal generator 1 may also amplify the DC voltage level at its input 1f. If it is desired either to attenuate the input signal in order to obtain a larger range spread of the AC voltage signal of interest with reduced resolution or to amplify said input signal to a greater extent in order to obtain a more precise signal resolution with a reduced range, the DC voltage level is also displaced and at worst causes the amplifier output to become saturated.

As is illustrated in FIG. 6, this can be avoided by virtue of the fact that the DC voltage offset of the measuring signal generator 1 can be changed to the value which is respectively most favourable for the evaluation. A cost-effective solution is to shift the divider ratio of the voltage divider 17, 18 by either connecting a further resistor 20 to earth in parallel with the one resistor 18, or a further resistor 19 to the positive operating voltage in parallel with the other resistor 17.

In order to eliminate the need for an external switch, the processor output 1e or 1g of the signal generator 1 serves simultaneously as a three-way switch by virtue of the fact that it is either connected at a high impedance (corresponding to an open switch) or is drawn to its reference potential of logic "0" when connected as an output (corresponding to a switch connected to earth) or is connected to a positive operating voltage of logic "1" when connected as an output. It is possible in this way for as many resistors as desired to shift, individually or connected in parallel, the offset voltage in a desired fashion. It is important that the component resistors are held at a very high impedance in relation to the measuring resistor 9 and to the impedance of the coupling capacitor 16.

The proposed evaluation circuit has various resistors which are subject to tolerances, for example also the voltage dividers described above. In order to keep the costs thereof low, that is to say to use resistors with wide tolerances, the invention proposes that the DC voltage offset which is respectively obtained for various divider ratios be measured in the signal generator 1 and buffered as a reference potential. This is done when it is known that no transistor 4, 5 is actuated, that is to say no current is flowing through the resistor 9. Values above the reference potential correspond to a positive current, and values therebelow correspond to a negative current, and only the respective difference from the value of the DC voltage offset is evaluated. The absolute value of the offset is therefore eliminated and its fault which is associated with the resistance tolerance drops out of the calculation.

Measuring resistors (tolerances of 0.1%, 0.5%, 1%) are very expensive compared to those with a normal tolerance (for example 5%). The tolerance of the measuring resistor 9 can, according to the invention, be eliminated by a calibration measurement by virtue of the fact that a known current is impressed into the measuring resistor 9 and is measured by the signal generator 1. The measurement result which is subject to tolerances is placed in a relationship with the expected set point value, and a value which represents this ratio, or is proportional thereto, is stored in a non-volatile memory. During later measurements of any desired signals, the stored correction value is applied to the measured value, and the precise result is therefore calculated. The calibration takes place, for example, during the fabrication by the manufacturer.

The other features of the AC voltage controller in FIG. 6 correspond to those of the fourth exemplary embodiment in FIG. 5.

The invention claimed is:
1. An AC voltage controller, comprising:
two AC voltage terminals;
two transistors having source terminals and connected between said two AC voltage terminals in series with a load, said two transistors connected in series such that said source terminals are connected to one another;
a signal generator for generating a switching signal for simultaneously actuating both of said two transistors;
a buffer connected downstream of said signal generator and set by said signal generator to simultaneously actuate both of said two transistors;
a circuit, selected from the group consisting of an actuation circuit and a driver circuit, connected downstream of said buffer, for actuating said two transistors in accordance with a set state of said buffer; and a current-limiting circuit for limiting or switching off a current through said two transistors in a case of an excessively large current through the load.

2. An AC voltage controller, comprising:

two AC voltage terminals;

two transistors having source terminals and connected between said two AC voltage terminals in series with a load, said two transistors connected in series such that said source terminals are connected to one another;

a signal generator for generating a switching signal for actuating said two transistors;

a buffer connected downstream of said signal generator and set by said signal generator to actuate said two transistors;

a circuit, selected from the group consisting of an actuation circuit and a driver circuit, connected downstream of said buffer, for actuating said two transistors in accordance with a set state of said buffer;

a current-limiting circuit for limiting or switching off a current through said two transistors in a case of an excessively large current through the load, said current-limiting circuit having a first switching element, a second switching element and at least one resistor connected in series with said two transistors;

a first voltage drop at said at least one resistor in one direction of the current through the load connects through said first switching element, and a second voltage drop at said at least one resistor in another direction of the current through the load connects through said second switching element; and when through-connection occurs said first switching element or said second switching element actuates at least one of said signal generator or said buffer in such a way that said two transistors are switched off, wherein through-connection of at least one of said first switching element or said second switching element brings about at least one of a resetting of said buffer or a triggering of said signal generator to prevent renewed setting of said buffer.

3. The AC voltage controller according to claim 1, wherein:

said signal generator has an input; and said buffer has an output connected to said input of said signal generator.

4. The AC voltage controller according to claim 1, wherein said signal generator senses a voltage drop across the load.

5. The AC voltage controller according to claim 4, wherein:

said signal generator has a first input and a second input; and the load has a first terminal and a second terminal, said first input of said signal generator is connected to the first terminal of the load, and said second input of said signal generator is connected to the second terminal of the load, in order to sense voltage profiles at the first and second terminals of the load.

6. The AC voltage controller according to claim 1, wherein said signal generator senses a current profile through the load.

7. An AC voltage controller, comprising:

two AC voltage terminals;

two transistors having source terminals and connected between said two AC voltage terminals in series with a load, said two transistors connected in series such that said source terminals are connected to one another;

a signal generator for generating a switching signal for actuating said two transistors;

a buffer connected downstream of said signal generator and set by said signal generator to actuate said two transistors;

a circuit, selected from the group consisting of an actuation circuit and a driver circuit, connected downstream of said buffer, for actuating said two transistors in accordance with a set state of said buffer;

a current-limiting circuit for limiting or switching off a current through said two transistors in a case of an excessively large current through the load; and a capacitor for sensing a current profile through the load, said capacitor extracting an AC voltage drop being proportional to an AC component across said at least one resistor and feeds the AC voltage drop to an input of said signal generator.

8. The AC voltage controller according to claim 7, further comprising a voltage divider connected to said capacitor, said capacitor extracting the AC voltage drop which is proportional to the AC component across said at least one resistor and sends the voltage drop to said voltage divider.

9. The AC voltage controller according to claim 8, wherein said signal generator sets a ratio of said voltage divider.

10. The AC voltage controller according to claim 6, wherein said signal generator senses a reference current when the load is switched off or when the current is known and to take a reference current into account in the sensing of the current profile through the load.

11. The AC voltage controller according to claim 1, wherein said signal generator is embodied in such a way that when a nonlinear load is switched on said signal generator ignores a response by a current limiting means for a predetermined time period.

12. The AC voltage controller according to claim 1, wherein said signal generator has a memory in which a switch-on behavior, which has been determined at least once, of the load can be stored.

* * * * *